United States Patent
Böhm et al.

(10) Patent No.: US 11,519,937 B2
(45) Date of Patent: Dec. 6, 2022

(54) CONTACT ELEMENT SYSTEM WITH AT LEAST TWO CONTACT ELEMENTS HAVING DIFFERENT CROSS-SECTIONAL AREAS, DIFFERENTLY SHAPED STRIPS IN AN INTERMEDIATE REGION, AND A SAME BENDING RIGIDITY

(71) Applicant: FEINMETALL GMBH, Herrenberg (DE)

(72) Inventors: Gunther Böhm, Nufringen (DE); Matthias Schnaithmann, Kernen im Remstal (DE); Achim Weiland, Mannheim (DE)

(73) Assignee: FEINMETALL GMBH, Herrenberg (DE)

( * ) Notice: Subject to any disclaimer, the term of this patent is extended or adjusted under 35 U.S.C. 154(b) by 350 days.

(21) Appl. No.: 16/618,855

(22) PCT Filed: Jun. 5, 2018

(86) PCT No.: PCT/EP2018/064683
§ 371 (c)(1),
(2) Date: Dec. 3, 2019

(87) PCT Pub. No.: WO2018/224458
PCT Pub. Date: Dec. 13, 2018

(65) Prior Publication Data
US 2020/0166541 A1    May 28, 2020

(30) Foreign Application Priority Data
Jun. 6, 2017  (DE) .................... 10 2017 209 510.5

(51) Int. Cl.
*G01R 1/067*  (2006.01)
*G01R 1/073*  (2006.01)
*H01R 13/24*  (2006.01)

(52) U.S. Cl.
CPC ....... *G01R 1/0675* (2013.01); *G01R 1/06716* (2013.01); *G01R 1/07357* (2013.01); *H01R 13/2407* (2013.01); *H01R 2201/20* (2013.01)

(58) Field of Classification Search
CPC .............. G01R 1/0675; G01R 1/06716; G01R 1/07357; H01R 13/2407; H01R 2201/20
(Continued)

(56) References Cited

U.S. PATENT DOCUMENTS 4,963,822 A * 10/1990 Prokopp ............ G01R 1/07328
324/763.01
5,286,208 A * 2/1994 Matsuoka ............ H01R 13/112
439/71
(Continued)

FOREIGN PATENT DOCUMENTS

CN        2432689 Y      5/2001
CN      101517422 A      8/2009
(Continued)

OTHER PUBLICATIONS

Office Action issued in Chinese Application No. 201880037039.7 dated Aug. 19, 2021. 17 pages.
(Continued)

Primary Examiner — Marcus E Harcum
(74) Attorney, Agent, or Firm — Harness, Dickey & Pierce, P.L.C.; Stephen T. Olson

(57) ABSTRACT

A contact element system has a plurality of pin-type or needle-type and electrically conductive contact elements of equal length, which each have two end regions for electrically contacting contact positions and each have an intermediate region under longitudinal loading, overcoming their bending rigidity, and are designed with lamellar sections in the intermediate region such that they have at least two strips which are substantially parallel to each other and run at a
(Continued)

Figure 1:
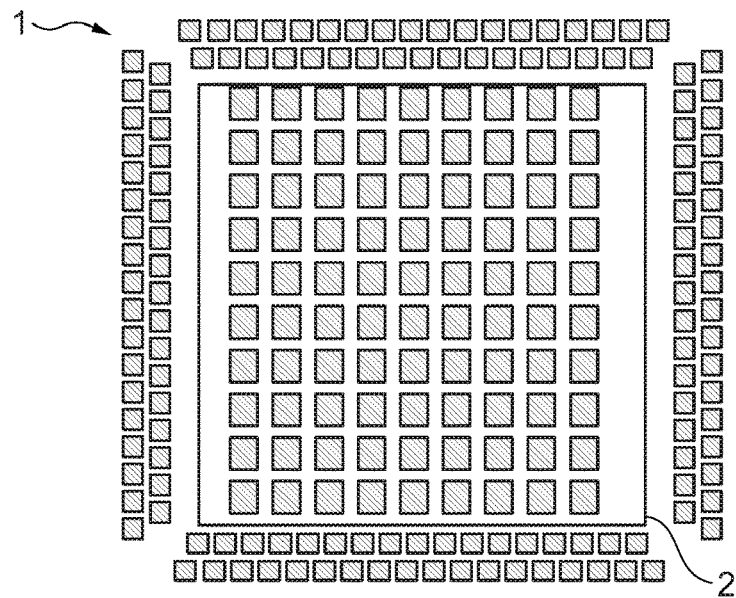

distance from one another. At least two of the contact elements have different cross sectional surfaces and differently formed strips in the intermediate region, wherein the forms of the strips are chosen such that the contact elements have the same or approximately the same bending rigidity.

11 Claims, 1 Drawing Sheet

(58) Field of Classification Search
USPC ............ 439/482, 65, 66, 700, 169; 324/325, 324/754.14
See application file for complete search history.

(56) References Cited

U.S. PATENT DOCUMENTS

| | | | |
|---|---|---|---|
| 5,385,477 A * | 1/1995 | Vaynkof | G01R 1/07357 439/591 |
| 5,865,641 A * | 2/1999 | Swart | H01R 12/721 439/482 |
| 6,150,830 A * | 11/2000 | Schmid | G01R 1/07357 324/756.03 |
| 6,196,866 B1 * | 3/2001 | Gaschke | G01R 1/07357 439/482 |
| 6,276,973 B1 | 8/2001 | Lin et al. | |
| 6,326,688 B1 | 12/2001 | Ochiai | |
| 6,414,504 B2 * | 7/2002 | Johnston | G01R 1/07357 324/755.02 |
| 6,419,500 B1 * | 7/2002 | Kister | H01R 12/714 439/91 |
| 6,515,496 B2 * | 2/2003 | Felici | G01R 1/07357 324/750.25 |
| 6,615,485 B2 * | 9/2003 | Eldridge | H05K 3/3426 257/E21.507 |
| 6,672,875 B1 * | 1/2004 | Mathieu | H01L 24/72 439/83 |
| 7,435,108 B1 * | 10/2008 | Eldridge | G01R 1/06727 439/81 |
| 7,501,840 B2 * | 3/2009 | Kimoto | G01R 1/06733 324/754.14 |
| 7,553,165 B2 * | 6/2009 | Mathieu | G01R 3/00 439/66 |
| 7,749,032 B1 * | 7/2010 | Yin | H01R 13/2421 439/482 |
| 7,782,072 B2 | 8/2010 | Fan et al. | |
| 7,808,261 B2 * | 10/2010 | Kimoto | G01R 1/06727 324/754.22 |
| 7,850,460 B2 | 12/2010 | Weiland et al. | |
| 8,063,651 B2 * | 11/2011 | Kamata | G01R 1/06727 216/11 |
| 8,203,352 B2 | 6/2012 | Fan et al. | |
| 8,435,044 B2 * | 5/2013 | Balucani | H01R 12/57 439/66 |
| 8,729,916 B2 * | 5/2014 | Chen | C25D 5/02 324/755.05 |
| 8,901,920 B2 * | 12/2014 | Takahashi | H01R 13/2428 439/700 |
| 9,535,096 B2 * | 1/2017 | Kimura | C25D 1/003 |
| 9,774,121 B2 * | 9/2017 | Kimura | G01R 1/06716 |
| 9,972,933 B2 | 5/2018 | Kimura et al. | |
| 10,119,991 B2 * | 11/2018 | Chen | G01R 31/2891 |
| 10,132,833 B2 * | 11/2018 | Eldridge | G01R 1/07357 |
| 10,256,564 B2 * | 4/2019 | Oda | H01R 13/2485 |
| 10,386,388 B2 * | 8/2019 | Acconcia | G01R 1/07378 |
| 10,698,003 B2 * | 6/2020 | Perego | G01R 1/07364 |
| 2002/0048973 A1 * | 4/2002 | Zhou | H01R 13/2435 257/E23.021 |
| 2002/0155735 A1 * | 10/2002 | Zhou | H01R 13/2464 439/66 |
| 2004/0121627 A1 * | 6/2004 | Grube | G01R 1/06716 439/66 |
| 2004/0163252 A1 * | 8/2004 | Khandros | H05K 3/308 174/250 |
| 2008/0074132 A1 | 3/2008 | Fan et al. | |
| 2008/0197869 A1 * | 8/2008 | Miyagi | G01R 1/44 324/755.06 |
| 2009/0045831 A1 * | 2/2009 | Kimoto | G01R 1/06727 324/755.05 |
| 2009/0181560 A1 * | 7/2009 | Cherian | H01L 23/49811 439/82 |
| 2009/0280676 A1 | 11/2009 | Weiland et al. | |
| 2010/0315111 A1 | 12/2010 | Fan et al. | |
| 2011/0006796 A1 * | 1/2011 | Kister | G01R 1/0408 324/756.01 |
| 2011/0062978 A1 | 3/2011 | Kister | |
| 2012/0242363 A1 * | 9/2012 | Breinlinger | G01R 1/06716 324/756.03 |
| 2014/0118016 A1 * | 5/2014 | Breinlinger | G01R 1/07357 324/750.25 |
| 2015/0061719 A1 * | 3/2015 | Lee | G01R 1/07378 324/756.03 |
| 2015/0280345 A1 | 10/2015 | Kimura et al. | |
| 2016/0178663 A1 * | 6/2016 | Prabhugoud | G01R 1/0466 324/750.24 |
| 2017/0242057 A1 * | 8/2017 | Mori | G01R 1/07342 |
| 2017/0346211 A1 | 11/2017 | Kimura et al. | |
| 2018/0011126 A1 * | 1/2018 | Acconcia | G01R 1/06733 |
| 2018/0088150 A1 * | 3/2018 | Kuga | G01R 1/07314 |
| 2018/0267083 A1 * | 9/2018 | Wei | G01R 1/06738 |
| 2018/0287305 A1 * | 10/2018 | Oh | H01R 13/6594 |

FOREIGN PATENT DOCUMENTS

| | | | |
|---|---|---|---|
| CN | 101577378 A | | 11/2009 |
| CN | 104755943 A | | 7/2015 |
| DE | 102008023761 A1 | | 11/2009 |
| DE | 102015001926 A1 | * | 8/2016 |
| JP | 2012093127 A | * | 5/2012 |
| JP | 2013007700 A | | 1/2013 |
| KR | 20110130593 A | * | 12/2011 |
| KR | 101363367 B1 | * | 2/2014 |
| WO | 2016146476 A1 | | 9/2016 |
| WO | 2016156003 A1 | | 10/2016 |
| WO | 2016177850 A1 | | 11/2016 |
| WO | WO-2021151524 A1 | * | 8/2021 ......... G01R 1/06705 |

OTHER PUBLICATIONS

Examination and Search Report received for the Singapore Patent Application No. 11201911734S, dated Nov. 23, 2020, 6 pages.
International Search Report (in English and German) and Written Opinion (in German) issued in PCT/EP2018/064683, dated Sep. 19, 2018; ISA/EP.
International Preliminary Report on Patentability and Written Opinion (English Translation)—Issued in 208053 PCT/EP2018/064683; dated Dec. 10, 2019; dated Mar. 31, 2020.

* cited by examiner

CONTACT ELEMENT SYSTEM WITH AT LEAST TWO CONTACT ELEMENTS HAVING DIFFERENT CROSS-SECTIONAL AREAS, DIFFERENTLY SHAPED STRIPS IN AN INTERMEDIATE REGION, AND A SAME BENDING RIGIDITY

CROSS-REFERENCE TO RELATED APPLICATIONS

This application is a 371 U.S. National Phase of International Application No. PCT/EP2018/064683, filed Jun. 5, 2018, which claims the benefit of German Patent Application No. 10 2017 209 510.5, filed Jun. 6, 2017. The entire disclosures of the above applications are incorporated herein by reference.

The invention relates to a contact element system having a plurality of pin-type or needle-type and electrically conductive contact elements of equal length, each having two end regions for electrically contacting contact positions and each having an intermediate region located between the end regions, wherein the contact elements can be elastically deflected in an arc in the intermediate region under longitudinal loading, overcoming their bending rigidity, and are designed with lamellar sections in the intermediate region such that they have at least two strips which are substantially parallel to each other and run at a distance from one another.

Contact element systems of the type mentioned above are known from prior art. With regard to the performance of an electrical test of an electrical test item, prior art teaches the establishment of a physical contact between the electrically conductive contact positions of the test item and the application of an electrical current and/or an electrical voltage for the detection of the functional capability of the test item. The use of a contact head, in which a plurality of contact elements is held, which are in contact with the contact positions of the test item at one end is known for the establishment of the physical contact. In order to ensure that all contact positions of the test item can safely come into physical contact, the contact elements are designed so that they can compress in order to compensate for height differences between the contact positions and thus ensure that all contact positions are in physical contact. In addition to the provision of spring contact pins, which are made from several parts, it is also known to use integral contact elements in the form of so-called contact or bending needles, which are characterized in that they can be laterally—with respect to their longitudinal extension—deflected when a force (contact force) is applied in the direction of their longitudinal extension. Optionally, these types of contact elements have an arched or S-shaped portion even in the non-loaded state, so that a deflection is always possible under load in the longitudinal direction. Because a large number of physical contacts take place during the test operation, i.e. the contact elements are frequently loaded and deflected, the durability and load capacity of the contact elements is of great interest. In order to ensure a secure physical contact and at the same time a secure deflection of the contact elements, contact elements are now known, for example, from the published patent application DE 10 2008 023 761 A1, which have an intermediate region between the end regions of the respective contact element which has a lamellar shape. For this purpose, this intermediate region has two or more strips, which extend in the longitudinal direction of the contact element and run at least substantially parallel to one another. The strips are laterally spaced from each other. This type of contact element reduces the force required to deflect the respective contact element without affecting the function of the contact element.

It should be noted that the surface of the contact positions is not or only slightly damaged to ensure that no reliability problems are experienced after the installation of the test item. Therefore, the goal is to apply the lowest possible contact force, that is, the force acting perpendicularly on the contact position, which acts in the longitudinal direction of the contact element. A more reliable contact can, however, be achieved if a higher contact force is used. A compromise and/or the best-possible contact force is determined when test arrangements are configured, which, on the one hand, result in damage that is still acceptable but, on the other hand, allow for a reliable execution of the test. This contact force should act on all the contacts used in the contact arrangement or all contact positions of the test item in the same way to achieve an advantageous result.

The types of the contact positions differ from each other, however. A first group of contact positions may be used to transmit analog or digital signals and other contact positions may be used to power the test item. Thus, there are different requirements for the contact elements, which themselves act as an electrical conductor or are used as such. It is therefore advantageous if the contact elements can be optimized for their respective electrical function, for example for a power supply with a large cable cross-section or for a signal transmission with a small cable cross-section, to also optionally exploit an existing space.

The invention is therefore based on the object of creating a contact system, which, on the one hand, allows for an advantageous mechanical, physical contact between the contact positions of the test item, and, on the other hand, is optimally adapted to the electrical requirements of the test item.

The object of the invention is achieved by a contact element system with the features of claim 1. This has the advantage that the contact elements have the same mechanical properties in relation to the contact force or bending rigidity but offer different electrical resistances or different electrical properties. The contact elements are advantageously made of the same material, so that the differences do not arise from the choice of material, which would also be possible in principle. Rather, the invention provides that at least two of the contact elements have different cross-sectional areas and differently shaped strips in the intermediate region, with the shapes of the strips being selected such that the at least two contact elements have the same bending rigidity. Because the contact elements have the same bending rigidity, the contact forces acting on the respective contact positions of the test item are the same. Due to the different-sized cross-sectional areas of the contact elements in the intermediate region, however, the contact elements offer different electrical properties due to the total electrical resistance resulting in each case due to the cross-sectional area. When mounting a test arrangement consisting of this contact element system, a selection of contact elements can be made, which are electrically configured for the respective test task in the best possible way and also have the same bending rigidity and thus the same contact force when contact is made.

In particular, the strips of the at least two contact elements may be of different lengths, which means that the shapes of the strips of the at least two contact elements thus differ in the length of the strips. As the length of the strips increases, the bending rigidity of the contact elements decreases. Therefore, the contact element with the longer strips preferably has a cross-sectional shape in the intermediate region, which increases the bending rigidity and thereby compensates for the greater length of the strips. Conversely, for example, a smaller overall cross-sectional area may be selected in the one contact element, which reduces the bending rigidity of the contact element as well, and the strips are extended to achieve the same bending rigidity in another contact element. As a result, the same bending rigidity can be achieved for both contact elements with different electrical properties.

Furthermore, it is preferably provided that the strips of the at least two contact elements have different depths. The term depth is understood to be the extension of the strips or of the contact elements perpendicular to the longitudinal extension and perpendicular to the bending direction. Since the strips have different depths, the respective bending rigidity is different as well, with the bending rigidity increasing due to the increase in material.

Furthermore, it is preferably provided that the strips of the at least two contact elements have different widths. In this case, the width of the strips means the extension of the strips perpendicular to the longitudinal extension and perpendicular to the depth, i.e. the extension which lies in the plane in which the strips are deflected in the event of a contact. As the width increases, the bending rigidity of the strips and thus of the respective contact element increases as well. In this case, for example, the wide strips of one contact element may be compensated by the shorter strips of the other contact element to achieve the same or almost the same bending rigidity, to obtain the same bending rigidity in both contact elements.

According to a preferred embodiment of the invention, at least two of the strips of the at least two contact elements may have different cross-sectional shapes. The cross-sectional shape of the respective lamella also influences the bending rigidity. Thus, the strips may, for example, have a triangular, rectangular, circular, oval or generally polygonal cross-section.

The at least two contact elements preferably have a different number of strips. Thus, for example, the bending rigidity of the one contact element increased by an increased depth is compensated by an additional lamella of the further contact element, in order to obtain the same bending rigidity.

Preferably, a first of the contact elements has a first number of strips with a first total cross-sectional area (=sum of the cross-sectional areas of all strips of the contact element), and a second of the contact elements has a second number of lamellas with a second total cross-sectional area, with the first number being greater than that second number and the first total cross-sectional area being larger than the second. This ultimately causes both contact elements to have the same bending rigidity, although they have different electrical resistances or line cross sections due to the reduced total cross-sectional area of the second contact element.

Particularly preferably, the depth of the strips of the first contact element is greater than that of the second, in order to keep the number of strips of the first contact element low but maintain the same bending rigidity. Furthermore, it is preferably provided that the length of the strips in this embodiment is longer than the length of the strips of the second contact element in order to keep the bending rigidity the same, with the result that, for example, the cross-sectional area of the first strips can be increased in return.

According to a preferred embodiment of the invention, the contact element system may have a plurality of the first and the second contact elements. Optionally, the contact element system has more than two different contact elements that meet the above requirements.

Further advantages and preferred features and combinations of features result from the description above and from the claims.

Below, the invention will be explained in more detail with reference to the drawing.

Figure 2:
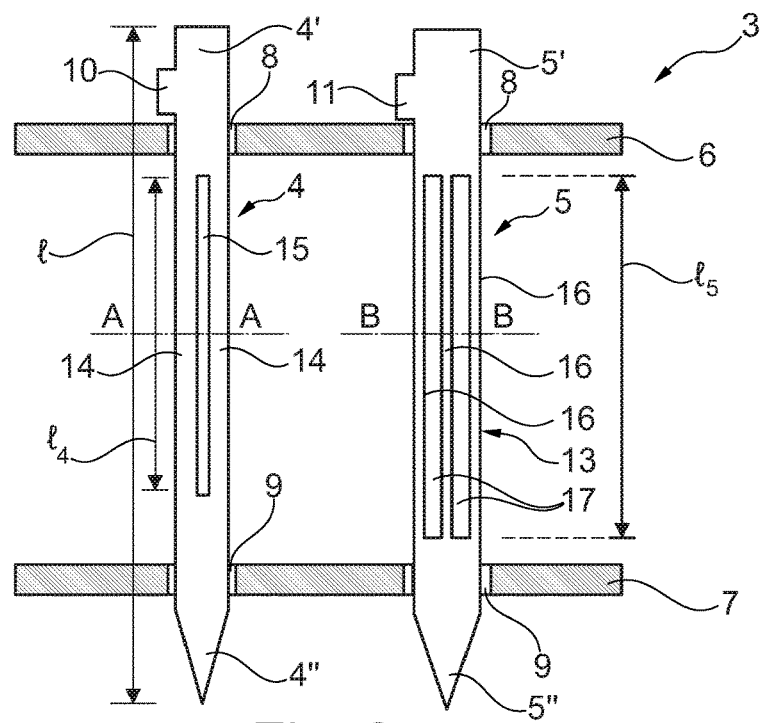
Figures 3, 4:
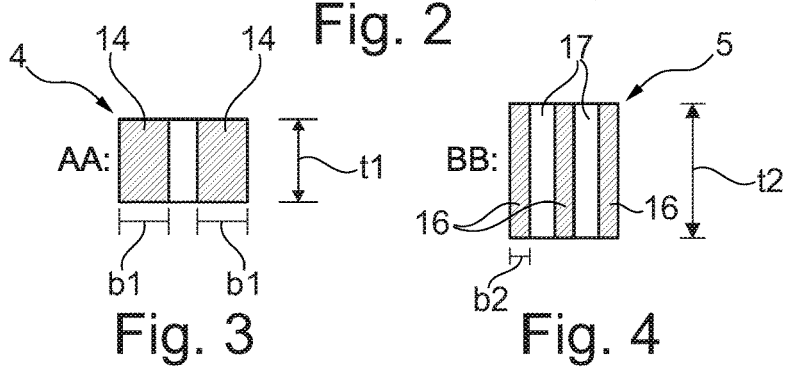

FIG. 1 shows a simplified representation of a contact pattern of a contact arrangement, FIG. 2 shows a contact head of a test device in a sectional view, FIG. 3 shows a detailed sectional view of the test head and FIG. 4 shows a further detailed sectional view of the test head.

FIG. 1 shows, in a simplified plan view, the pattern of a contact arrangement 1 for an electrical test item having a plurality of electrically conductive contact positions which are to be contacted by a test device and which are shown here as boxes. In a central region, which is characterized hereby by a box 2, contact positions are provided, which are subjected to a high current to carry out the test or to supply the test item with electricity (larger boxes), while contact positions are present in the region outside of the box 2, which are subjected to a comparatively lower current, in particular for the transmission of signals (smaller boxes). This results for example from the fact that the inner contact positions are current-carrying contact positions, while the outer contact positions are only signal contact positions for the transmission of analog or digital signals.

To be able to contact the different contact positions, the test device 1 advantageously has a contact head 3, which carries different types of contact elements 4, 5, which were optimized for establishing an electrical contact between the different contact positions.

FIG. 2 shows the contact head 3 in a simplified sectional view. It has two guide plates 6, 7, which run parallel to each other and are spaced apart from each other, and in which a plurality of guide openings 8 and 9 are formed. The guide openings 8, 9 are distributed in the guide plates 6, 7 in the form of a matrix, for example according to the contact arrangement 1 of the contact positions, as shown in FIG. 1.

The guide openings 8, 9 of the two guide plates 6, 7 are arranged either in alignment or laterally offset from one another, with one contact element of one of the guide openings of the two plates 6, 7 being guided.

The contact elements 4, 5 are designed as pin-shaped or needle-shaped contact elements 4, 5, which have the same length 1. Their end regions serve as contact positions for the contacting of the contact elements of the test item or the superordinate test device, which carries out the test and applies a current or a voltage to the contact elements 4, 5 or receives current signals, for example. At their upper end region 4' or 5', the contact elements 4, 5 optionally each have a lateral projection 10 or 11, which prevents the contact elements 4, 5 from slipping through the respective guide opening 8 of the guide plate 6. In an intermediate region 12 or 13 located between the end regions 4', 5' and 4", 5", the contact elements 4, 5 are lamellar.

In this case, the left contact element 4 in FIG. 2 has two strips 14, which run parallel to each other and are spaced from each other by a slot 15. The strips 14 and the slot 15 extend in the longitudinal direction of the contact element 4.

In contrast, the contact element 5 has three strips 16, which are separated by two slots 17. These strips 16 also run parallel to one another in the longitudinal direction of the contact element 5.

FIG. 3A shows a cross section through the contact element 4 in the intermediate region according to line A-A. It can be seen here that the strips 14 have a depth t1 which is greater than their respective width b1.

FIG. 4 shows a cross section through the contact element 5 along the B-B line from FIG. 2. The contact element 5 and thus its strips 16 have a greater depth t2 compared to the depth t1 of the contact element 4. At the same time, the individual strips 16 have a smaller width b2. In addition, the strips 16 and the slots 17, as shown in FIG. 2, are longer and have a greater length 15 than the strips 14 and the slot 15, which have a correspondingly smaller length 14.

Overall, however, the advantageous embodiment of the strips 14, 16 and the intermediate regions 12 and 13 causes both contact elements 4, 5, to have the same bending rigidity, but different total cross-sectional areas, which form the cross-sectional areas of the individual strips 14, 16.

In a contacting operation, the contact elements 4, 5 are axially subjected to a contact force along their longitudinal extension. As a result, the contact elements 5 may be deflected laterally in the intermediate region 12, 13 so that the contact ends 4" and 5" can deflect in the direction of the contact ends 4' and 5'. The bending rigidity defines the axial force to be applied which is necessary to cause the deflection. Due to the advantageous embodiment and the same bending rigidity, the same contact force is necessary to achieve a deflection/compression. As a result, the force exerted by the contact elements 4, 5 on the contact positions of the test item, is also equal or nearly equal and leads to no or negligible damage to the contact positions but provides a sufficiently guaranteed contact at the same time.

Since, in addition, the cross-sectional areas of the strips 14, 16 are selected differently due to the different width, depth and number of strips 14, 16, different electrical conductor cross-sections or resistances of the contact elements 4, 5 result, which means that, for example, different currents run through the contact elements 4, 5, even if the same voltage is applied. As a result, an advantageous performance of the contacting and the testing of the test item is guaranteed.

In this case one contact element 4 each is provided for each of the outer contact positions according to the contact pattern 1 of FIG. 1, and one contact element 5 each for each of the respective inner contact positions. Accordingly, a contact element system comprised of different contact elements 4, 5 is offered, which have the same or almost the same bending rigidity and thus the same contact force but provide different line cross-sections or total cross-sectional areas. Optionally, the contact element system may also comprise further contact elements, which offer a different line cross-section with the same bending rigidity/contact force, so that the contact element system may comprise, for example, three or more different contact elements, which ensure the same or almost the same contact force/bending rigidity.

The invention claimed is:

1. A contact element system comprising: a plurality of contact elements, each contact element being identically long, having a shape selected from a pin-shape and a needle-shape, and being electrically conductive, each contact element having two end regions for electrically contacting contact positions and having an intermediate region between the end regions, wherein each contact element is elastically bendable in the intermediate region in a longitudinal extension when a load is applied to overcome a bending rigidity, wherein each contact element has a lamellar shape in the intermediate region and the intermediate region includes at least two strips that run substantially parallel to each other and are spaced from one another, wherein at least two contact elements of the plurality of contact elements comprise different cross-sectional areas and differently shaped strips in the intermediate region, with shapes of the strips chosen such that the at least two of the contact elements have the at least substantially a same bending rigidity and the strips of the at least two contact elements have different lengths.

2. A contact element system comprising: a plurality of contact elements, each contact element being identically long, having a shape selected from a pin-shape and a needle-shape, and being electrically conductive, each contact element having two end regions for electrically contacting contact positions and having an intermediate region between the end regions, wherein each contact element is elastically bendable in the intermediate region in a longitudinal extension when a load is applied to overcome a bending rigidity, wherein each contact element has a lamellar shape in the intermediate region and the intermediate region includes at least two strips that run substantially parallel to each other and are spaced from one another, wherein at least two contact elements of the plurality of contact elements comprise different cross-sectional areas and differently shaped strips in the intermediate region, with shapes of the strips chosen such that the at least two of the contact elements have the at least substantially a same bending rigidity and the strips of the at least two contact elements have different depths.

3. The contact element system according to claim 1, wherein the strips of the at least two contact elements have different widths.

4. The contact element system according to claim 1, wherein at least two of the strips of the at least two contact elements have different cross-sectional shapes.

5. The contact element system according to claim 1, wherein the at least two contact elements have a different number of strips.

6. The contact element system according to claim 1, wherein a first contact element of the plurality of contact elements has a first number of strips with a first total cross-sectional area, and a second contact element of the plurality of the contact elements has a second number of strips with a second total cross-sectional area, wherein the first number is greater than the second number and the first total cross-sectional area is greater than the second.

7. The contact element system according to claim 6, wherein a first depth of the strips of the first contact element is greater than a second depth of the strips of the second contact element.

8. The contact element system according to claim 6, wherein a first length of the strips of the first contact element is greater than a second length of the strips of the second contact element.

9. The contact element system according to claim 1, wherein a plurality of first contact elements and a plurality of second contact elements are present.

10. The contact element system according to claim 1, wherein a first contact element of the plurality of contact elements has at least two strips and a second contact element of the plurality of the contact elements has more strips than the first contact element.

11. A contact element system comprising:
a plurality of contact elements, each contact element being identically long, having a shape selected from a pin-shape and a needle-shape, and being electrically conductive, each contact element having two end regions for electrically contacting contact positions and having an intermediate region between the end regions, wherein each contact element is elastically bendable in the intermediate region in a longitudinal extension when a load is applied to overcome a bending rigidity, wherein the plurality of contact elements includes:
- a first contact element having a lamellar shape in the intermediate region and the intermediate region includes at least two strips that run substantially parallel to each other and are spaced from one other, and
- a second contact element having a lamellar shape in the intermediate region and the intermediate region includes at least two strips that run substantially parallel to each other and are spaced from one other, and wherein the intermediate region of the first and second contact elements have different cross-sectional areas and differently shaped strips, with shapes of the strips chosen such that the first and second contact elements have at least substantially a same bending rigidity.

* * * * *